United States Patent [19]

Ott

[11] Patent Number: 5,637,012
[45] Date of Patent: Jun. 10, 1997

[54] ADAPTER FOR AN AUTOMATIC INSPECTION DEVICE OF PRINTED CIRCUIT BOARDS

[75] Inventor: Rainer Ott, Munich, Germany

[73] Assignee: Test Plus Electronic GmbH, Germany

[21] Appl. No.: 379,629

[22] PCT Filed: Aug. 6, 1993

[86] PCT No.: PCT/EP93/02104

§ 371 Date: Mar. 20, 1995

§ 102(e) Date: Mar. 20, 1995

[87] PCT Pub. No.: WO94/04015

PCT Pub. Date: Feb. 17, 1994

[30] Foreign Application Priority Data

Aug. 6, 1992 [DE] Germany .................. 42 26 069.8

[51] Int. Cl.⁶ .................................................. H01R 11/18
[52] U.S. Cl. ................................................. 439/482
[58] Field of Search ............................. 324/761, 754; 439/587, 482, 733.1, 66, 444

[56] References Cited

U.S. PATENT DOCUMENTS 4,941,847  7/1990  Welsh ..................... 439/733.1

FOREIGN PATENT DOCUMENTS

| 0 135 384 | 3/1985 | European Pat. Off. . |
| 0 189 179 | 7/1986 | European Pat. Off. . |
| 0 374 434 | 6/1990 | European Pat. Off. . |
| 38 12 654 | 11/1988 | Germany . |
| 38 15 573 | 11/1989 | Germany . |

*Primary Examiner*—Neil Abrams
*Assistant Examiner*—Barry Matthew L. Standig
*Attorney, Agent, or Firm*—Scully, Scott Murphy and Presser

[57] ABSTRACT

An adapter for testing printed circuit boards which has a support plate and an advantageous fixation of exchangeable spring-loaded contact elements, also known as spring-loaded probe assemblies, therein for providing electrical contacts to a printed circuit board in predetermined contact locations. The support plate (2) is comprised of several layers (20, 21, 22), and the contact elements (4) are set into bores (3) and are removably held and axially locked into place in the bores (3) between two layers (20, 22) by a bead (51) formed on the contact elements, preferably in a vacuum-tight manner.

11 Claims, 1 Drawing Sheet

ADAPTER FOR AN AUTOMATIC INSPECTION DEVICE OF PRINTED CIRCUIT BOARDS

This invention relates to an adapter for testing printed circuit boards on a given test system and for similar applications. In particular, the invention concerns measures for an advantageous fixation of contact elements present in such adapters.

BACKGROUND OF THE INVENTION

1. Field of the Invention

Details of state-of-the-art adapters and test systems are disclosed in patents, DE-A-4010297, DE-A-4107767 and DE-P-4212837.

In the art of printed circuit board testing, it is common to use adapters which mainly consist of a support plate and contact elements set into this support plate. Spring-loaded contact elements, also known as spring-loaded probe assemblies, provide for electrical contact to a printed circuit board with predetermined contact locations.

Rigid contact elements, located in the same support plate, are sufficient to contact the spring-loaded contact points of the test system. There is usually a lateral offset between a contact point of the circuit board with reference to the related contact point of the test system, to which it is to be electrically connected. This connection is usually accomplished using a pair of contact elements. These contact elements are interconnected by means of a wire in "Short-Wire" technology. Adapters of so-called "Long-Wire" technology usually only have spring-loaded contact elements to provide contact with the contact points of the circuit board, and a longer wire or lead for connection. The ends of these leads merge into a contact block, which can be equipped with contact elements that are of similar design to contact elements used in a "Short-Wire" adapter. This invention, which will be described in more detail later, is also suitable for contacts at this side of the adapter, as well as for similar applications.

A particular adapter is specifically designed for a given circuit board and can in general only be used for that particular kind of circuit board. If the circuitry of the board is modified, then usually, at least the adapter has to be modified, unless it is economically advantageous to employ a new adapter. Costly parts of such adapters are the contact elements, in particular the spring-loaded contact elements. Also for ecological reasons, the ability to re-use such contact elements is desirable. There are state-of-the-art proposals for contact elements in a support plate, which are exchangeable, however they can be securely locked into place for practical application.

2. Description of the Prior Art

One prior art proposal is based on the idea that the contact elements in the support plate contain notches and these contact elements are locked by means of a locking plate that interlocks with these notches. Compared to exchanging contact elements that are driven or glued into the support plate, this already represents a substantial improvement.

SUMMARY OF THE INVENTION

The purpose of this invention is to present a solution for a locking mechanism for contact elements in a support plate which is easier to manufacture and simpler to use than present art proposals, whereby precise locking of the contact elements in the support plate has to be ensured; and preferably also vacuum tightness, at the locations of contact elements in the support plate, be achieved.

The invention is based upon several according considerations. On the one hand, this is the re-use of as many components as possible of an already present adapter that will not be required later on. Due to the variety of circuit boards, a support plate of the corresponding test adapter with a plurality of bores can generally not be re-used. Therefore, a new raw material plate necessarily has to be used for a new support plate. This is particularly true if the circuit board is fixed on a chuck by applying vacuum. Therefore, the costly means for locking contact elements should not be placed on the support plate but be a characteristic of the individual, recycleable, contact elements. The corresponding solution of the invention consists of providing means on the support plate for locking the contact elements. This is realized by simply applying layers on the basis support plate, whereby the latter preferably is a most simple, present-art support plate. The layers for several final support plates can be applied together to a large scale on a raw material plate, commonly used for known present-art support plates, which is made of fiberglass-reinforced Epoxy resin. This has a negligible effect on the costs. It is an object of this invention to have two layers be applied to one side of the support plate, of which the outer one is one with a resulting elastic effect in this layer. The underlaying intermediate layer made of plastic or elastic material however consists of very compliant material. The layer with the elastic effect is used as a kind of spring for locking the bead formed on the contact element of this invention. In the locked position, this bead is located between the edge of the bore in the rigid base support plate and the elastically compliant edge of the material of the outer layer. When a contact element is inserted in the bore of the support plate, this bead of the contact element is driven with adequate pressure through the bore in the outer layer, whereby the diameter of the bore in the material of the outer layer and/or the material in the vicinity of the bore is elastically yielding to the exerted pressure, until this bead has passed through this bore into the second outer layer. By applying appropriate tensile force, this contact element or this bead can be pulled out from the locking position behind the edge of the bore in the second outer layer through this bore against the elastic resistance of the material of this second layer. Through variation of the thickness of the second layer and by choice of the material of this second layer, a minimum force for inserting and extracting the contact element can be selected, whereby this force is large compared to the forces that are axially applied to the contact elements when using the adapter. This ensures secure locking of a contact element in the support plate.

In this invention, an electrically conductive layer, used commonly as a shield in some applications, can be provided on the entire outer surface of the second layer of the support plate. The bead that is to be provided on the outer circumference of the contact element is preferrably a ledge that remains after lathing the outer surface of the contact element. Aside from pressing a bead, also the machining of the contact elment is, relatively seen, not a big expenditure, since contact elements can be re-used very often, therefore the technical efforts are well amortized.

Further details of the invention are outlined in the following descriptions of a sample embodiment and further realizations of this invention.

DESCRIPTION OF PREFERRED EMBODIMENTS

Figure 1:
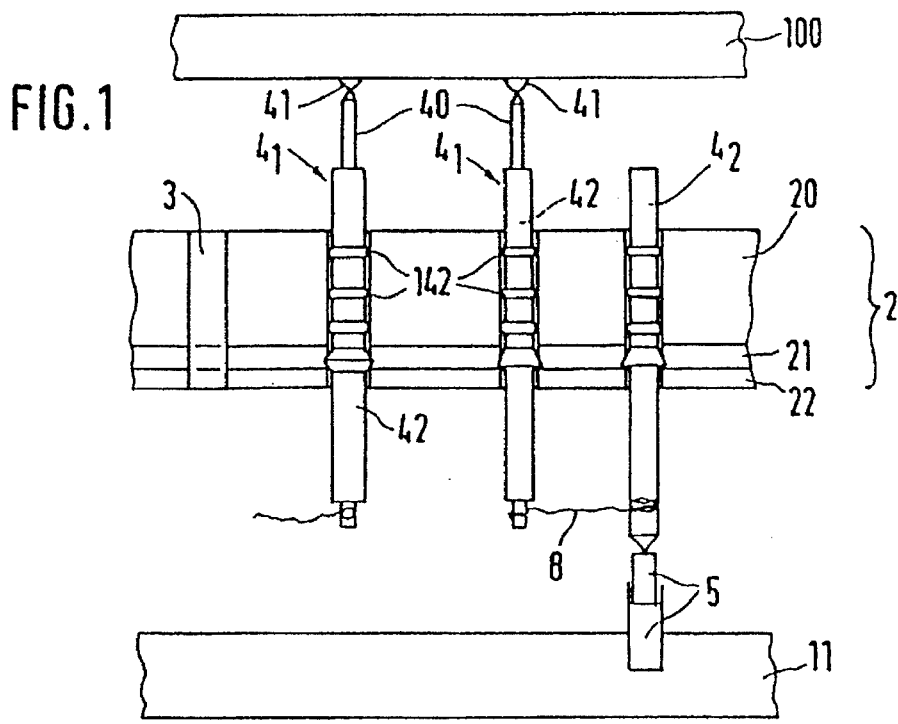
FIG. 1 shows an elevational view of an adapter in conjunction with a printed circuit board and a test system.

A cross-sectional view of an adapter 1 of this invention is displayed in FIG. 1. A circuit board 100 is interfaced to a given contact grid of a standardized test system 11 by using an adapter 1 of this invention. The contact points 41 of circuit board 100 are used for providing electrical contact between the adapter 1 and the circuit board 100. This FIG. 1 displays an adapter where the printed circuit board is directly pressed onto the probe pins, as is done for example in mechanically actuated systems. A/N additional board carrier plate, well known in present art, which is necessary for vacuum actuated systems, is not shown in this figure for simplification.

The adapter 1 mainly consists of a support plate 2 with bores 3, in which the individual contact elements 4 are inserted. For contacting the contact points 41 of the circuit board 100, spring-loaded contact elements $4_1$ are generally provided. The contact elements contain probe tips 40, that are axially held by a spring, and due to the placement of the contact element 4 in the support plate 2, electrical contact is established with the corresponding contact point 41 of the circuit board 100. Contact element $4_2$ is placed axially in the support plate 2 corresponding to a usually spring-loaded contact element 5 in the test system 11. Contact element $4_2$ is in electrical contact with this contact element 5 of the test system 11. The electrical connection 8, which is schematically shown in FIG. 1, is used to complete the required electrical connection between the said circuit point 41 of the circuit board 100 and the laterally offset contact element 5 of the test system 11. Since this by itself is well known state-of-the-art, FIG. 1 displays only a single contact element $4_1$, that is in contact with a contact point 41 of the circuit board, and only one corresponding contact element $4_2$, that is in contact with the test system. The support plate of a known adapter contains a plurality of such contact elements $4_1$ and $4_2$, which can also differ in form.

FIG. 1 displays a single bore 3, in which at this point no contact element is inserted.

In this invention, the support plate 2 encompasses a basis support plate 20, which has the stiffness and dimensional stability that are required by a standard support plate 2. In particular, fiberglass-reinforced Epoxy resin is used as material for such support plate or rather basis support plate 20. Such material may be precisely drilled, such that the bores 3 are very exact in measurement. This is particularly important, if the contact elements 4 are to be densely arranged.

As is well known in the art, the contact elements or rather the hollow casings, in which the contact elements are lodged, are driven, glued or fixed in similar manner in the bores of such a support plate. This art of fixation makes it at least difficult to remove one or several contact elements from such a support plate, if these contact elements are to be re-used, for example for a different adapter with different contact element locations.

The support plate 2 of this invention with its basis support plate 20 has on the lower side of the basis support plate, shown in FIG. 1, a first layer 21 and a second layer 22, which are positioned on top of each other, as displayed. These two layers 21 and 22 to be described in further detail, serve, together with the basis support plate 20, to fix the contact elements 4 of this invention such that they are sufficiently axially locked into place to withstand the tension that arises due to the contact with the circuit board 100 and the test system 11, in practical applications of such adapters. On the other hand, these two layers 21 and 22 are chosen such that an individual contact element 4 can be inserted into and removed from the support plate, for example by holding it between two fingers. This, for example, enables the multiple re-use of contact elements 4 in support plates 2 with bores that are positioned for individual applications.

The bores 3 are positioned exactly in a particular support plate of this invention, consisting of the basis support plate 20 and the first and second layers 21 and 22, according to the given distribution of contact elements 5 of the test system 11 and according to the distribution of the contact points 41 of the corresponding circuit board 100, whereby the bores are drilled straight through the three composites of the support plate 2.

In the following, further explanations of this invention will be presented in following figures for simplicity with reference to certain embodiments of this invention, but the general validity shall not be considered limited to these aforementioned embodiments.

Figure 2:
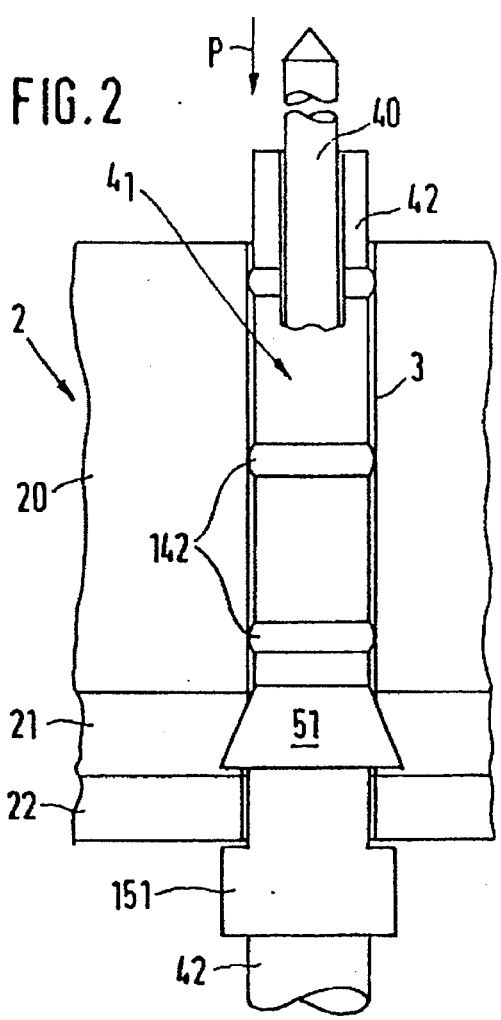
FIG. 2 shows a detailed view of a contact element, how it is set in the support plate and how it is locked as described in this invention.

As already explained in the general description of the invention, the basis support plate 20 assumes the function of locking the contact elements 4 into place in the bores 3 without leeway. FIG. 2 shows a spring-loaded contact element $4_1$ with the probe tip or probe pin 40, that preferably has a pointed tip at the upper end for providing contact. Alternatively, it is also possible to have a flat-ended probe tip. This probe tip 40 (not described in further detail, since it is well known) is lodged in a hollow casing 42 such that it is axially moveable, but held with minimal lateral leeway. The hollow casing 42 is placed similarly without leeway in the bore 3 of the basis support plate 20. For this purpose, the casing may have ledges, for example ring-shaped beads 142, on the outer surface, which tightly fit into the interior of bore 3. These beads 142, however, permit an axial displacement of the hollow casing 42 in the bore 3 of the basis support plate 20.

For reliable positioning of the contact element 4 in the axial direction, the casing 42 has a (or possibly another) ring-shaped bead 51 of this invention, as is more evident in FIG. 2 than in FIG. 1. Instead of such a ring-shaped bead 51, it is principally possible to provide functionally equivalent ledges that only represent parts of a ring, which shall also be considered part of this invention.

As can be seen in FIG. 2, the ring-shaped bead 51 of this invention is located in layer 21 of the support plate 2 when the contact element 4 is axially positioned in bore 3 of said support plate. The material of said layer has, compared to the other composites of support plate 2, relative high elasticity/plasticity, such that, when the contact element 4 is inserted in bore 3, the bead finds this stable position by itself.

The contact element 4 is inserted into position in the bore 3 by first pushing the bead 51 through the bore 3 located in the second layer 22 of the support plate 2. Thereby, the elastic effect of the second layer 22 of this invention offers a certain resistance against the pushing of bead 51 until the bead has been completely pushed through this layer 22 into the position displayed in FIG. 2. On the other hand, in this position, the elastic effect of layer 22 works such that an extraction of the contact element 4 or the bead 51 through the second layer 22 by the forces that are present during regular operation of the adapter is excluded. An example of such force, which is excerted from the contact point 41 onto the tip of the contact element 4 during application of the adapter, is indicated by symbol P in FIG. 2.

The elastic effect of the second layer 22 is, however, with respect to the shape and dimension of the bead 51, such, that an extraction of the contact element 4 from the bore 3, that means bead 51 would have to pass through the bore of the second layer again, is possible with adequately high tensil forces, without damaging the contact element 4 in any manner. This contact element can be re-used in a different adapter.

This second layer 22 may consist of a material with appropriate specific elasticity, for example a layer of PVC material. A hard material, such as fiber-glass reinforced Epoxy resin, as is used for the basis support plate 20, may be used as well, however, it has to be relatively thin. An essential object of this invention is the fact that, considering the constant diameter of bore 3 in the support plate 20 and in both layers 21 and 22, the material of this second layer 22 in the vicinity of the bore is of such elasticity that on the one hand, bead 51 can be pushed through the bore 3 in this second layer 22 using appropriate forces, on the other hand, the contact element 4 is axially locked in place by the retracting second layer of this invention.

It shall be brought to attention that the material of the first layer 21 may even be air. The second layer 22, which may consist of PVC material, may only be attached to the support plate at certain points or areas, for example by using glue. At other places, air pockets exist between the basis support plate 20 and its second layer 22. In the area of such an air pocket 21, the bead 51 can be locked into place as described in this invention.

Preferrably, the material for the first layer 21 consists of adhesive tape of appropriate thickness, which may be used to attach the second layer to the basis support plate.

Figure 3:
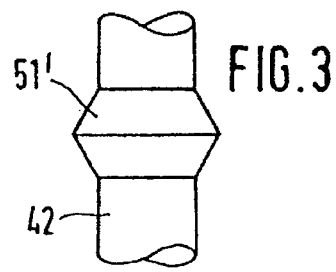
FIGS. 3 to 5 show embodiments of different forms of the locking bead.

FIG. 3 shows in a detail illustration a different form of bead of this invention. This double-coned-shape 51' makes it possible to determine the forces for inserting and extracting the contact element 4 independently. Concerning the forces for inserting the contact element 4 on the one hand and for extracting it on the other hand, the composition of the material of the first layer 21 has to be considered. This means that even for a symmetric form 51', the force for inserting the contact element 4 may be higher than the force for extracting it.

Figure 4:
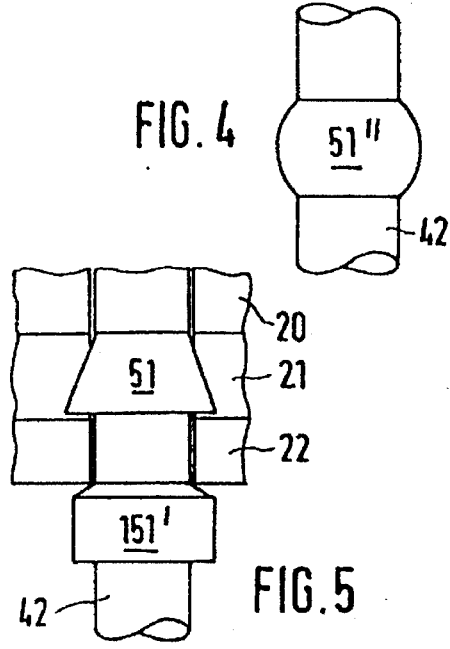

FIG. 4 shows a partial view of a bead 51" with an almost circular cross-section.

For the sake of completeness, an additional bead or ledge 151 shall be pointed out, that is particularly provided for contact elements of the kind $4_2$, which are used for interfacing contact elements 5 of the test system 11. For these contact elements $4_2$, the force that builds up during operation of the adapter 1 and that is having an effect on the individual contact elements, is directed in the same direction as the forces that are applied for inserting the contact elements $4_2$ (and $4_1$) into the support plate 2. This additional bead 151 is an abutment for the forces exerted from the test system 11 onto the contact elements $4_2$. This additional bead 151 may also be useful for the sealing that is yet to be described.

Given the theory of the invention and the subsequent explanations, it is obvious for an expert, how the material properties and dimensions of the second layer 22 and the first layer 21 have to be chosen with respect to the shape and dimensions of the bead 51. For example, it has to be considered that, especially in the case of a soft elastic material like PVC, the material of the second layer 22 is pushed somewhat in the direction of the basis support plate 20 when the bead 51 is pushed through the bore of the second layer 22, because the material of the first layer is more resilient. The height of the bead 51 may have to be designed a certain percentage smaller than the thickness of the first layer 21, so that the maximum diameter of the bead 51 is ensured to entirely pass through the bore 3 of the second layer 22 and is locked at place according to this invention. The hard material of the thick basis support plate 20 is practically totally non-resilient for the bead 51. The resulting minor tolerance of the axial positioning of the contact element 4 is negligible compared to practical requirements, especially when spring-loaded contact elements are used.

For practical applications, the basis support plate 20 is 8 mm thick and consists of the previously mentioned fiberglass-reinforced Epoxy resin. For the first layer 21, an adhesive tape with a thickness of approximately 0.2 mm can be used. The elastic PVC layer used for second layer 22 has, for example, a thickness of 1 mm. For the bores in the basis support plate 20 and also for the first and second layers 21 and 22, a diameter of 1.7+0.01 mm is a realistic application. The maximum diameter of the bead 51 of this invention can accordingly be 1.75 mm, with the general diameter of the contact element 4, that is inserted in the bore, being 1.7 mm.

For the sake of completeness, it shall be pointed out that, also in this invention, spring-loaded elements with two hollow casings fitted axially in one another may be used. In this case, the outer casing is designed according to casing 42 and axially positioned by bead 51 locking into place in the area the first layer 21 of the support plate 2. The inner casing and the probe pin 40 of the spring-loaded contact elements are then exchangeably inserted in the outer casing, as is well known state-of-the-art of spring-loaded contact elements whose outer casing is fixed by driving or glueing it into a support plate. Independent from the exchangeability of only the inner casing and the therein fixed probe pin, which mainly supports repair purposes, such a double-casing contact element may be inserted in a support plate 20, 21, 22 of this invention and locked as described in this invention, and be extracted from aforementionend support plate, for example for re-use, without any damage.

In many cases, the circuit board 100 is fixed on a drilled board carrier plate equipped with a sealing by applying vacuum. For this purpose it is generally necessary that the support plate 2 of the adapter with the insert contact elements be a vacuum-tight plate. It is therefore necessary that the contact elements be inserted in the bores 3 as vacuum-tight as possible. Using this invention, this additional condition is also met, because, under exterior air pressure, the elastic material, in particular PVC material or other soft elastic material, is pressed onto the lower edge of bead 51 of this invention shown in the figures. This provides a seal between the material of the second layer 22 in the vicinity of bore 3 and the lower edge of the bead 51 of this invention. This seal may have to be considered in the design of the form and dimensions of the bead 51. At least additionally, the material of the first layer 21, with the exception of the aforementionend air pockets, can contribute to this seal if the material is properly chosen. The (additional) sealing effect of the bead or ring 151, particularly that of contact elements that are exposed to pressure from the direction of the test system during operation, has been mentioned above.

Figure 5:
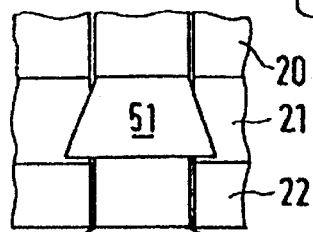

An embodiment with a combination of a bead 51 with a bead 151' is shown in FIG. 5. This combination particularly serves as a seal if axial forces are exerted from both possible directions.

The term "bead" in terms of this invention is used as a collective noun representing all forms that may be used for locking the contact element into place in conjunction particularly with the second layer 22 with its elastic effect, as described in this invention.

I claim:

1. An adapter for a test system (11) for circuit boards (100) comprising:
   a. a support plate (2) defining bores (3);
   b. pin-shaped contact elements (4), that are due to a given fitting, inserted essentially without lateral leeway into corresponding bores (3) of the support plate (2);
   c. said support plate (2) is a composite plate (20, 21, 22) comprising a hard plastic material basis support plate (20) having, on one side a first layer (21), and on said first layer (21) a second layer (22), and each corresponding bore (3) being drilled in the support plate (2) axially aligned with the same diameter throughout the support plate;
   d. each contact element (4) being equipped with a ring-shaped bead (51) on its outer circumference that is inserted into a corresponding bore (3);
   e. said second layer (22) material comprising an elastic material having a material thickness, and said first layer (21) material being very compliant and having a significantly higher resilience than the second layer (22) material, and both said first and second layer (21, 22) materials and said bead (51) maximum outer diameter and axial height being determined with reference to each other and to the diameter of the corresponding bore (3) such that the inserted contact element (4) is, within specified tolerances, axially locked into place within the first layer (21) between an inner surface of the basis support plate (20) and an inner surface of the second layer (22).

2. An adapter as in claim 1, wherein the bead (51) is essentially shaped like a truncated cone having a large conical diameter, and is oriented with the large conical diameter adjacent to the second layer (22) in the locked position.

3. An adapter as in claim 1, wherein the bead (51) is shaped like a double cone (51').

4. An adapter as in claim 1, wherein when the bead is in the locked position, the surface of said bead adjacent to said second layer (22) is shaped to maintain a vacuum seal between the surface of the bead adjacent to said second layer (22) and an adjacent edge of the elastic material of the second layer (22).

5. An adapter as in claim 1, characterized by an additional bead (151, 151') on the contact element (4) positioned at an offset distance from the locked bead (51, 51', 51"), wherein the offset distance is essentially equal to the thickness of the second layer (22).

6. An adapter as in claim 1, wherein the first layer (21) is an adhesive layer between the basis support plate (20) and the second layer (22).

7. An adapter as is claim 1, wherein the first layer (21) includes air pockets, at least in the vicinity of the bores (3), between the basis support plate (20) and the second layer (22).

8. An adapter as in claim 2, characterized by an additional bead (151, 151') on the contact element (4) positioned at an offset distance from the locked bead (51, 51', 51"), wherein the offset distance is essentially equal to the thickness of the second layer (22).

9. An adapter as in claim 2, wherein the first layer (21) is an adhesive layer between the basis support plate (20) and the second layer (22).

10. An adapter as in claim 9, wherein when the bead is in the locked position, the surface of said bead adjacent to said second layer (22) is shaped to maintain a vacuum seal between the surface of the bead adjacent to said second layer (22) and an adjacent edge of the elastic material of the second layer (22).

11. An adapter as in claim 3, wherein the first layer (21) is an adhesive layer between the basis support plate (20) and the second layer (22).

* * * * *